United States Patent [19]

Campbell et al.

[11] Patent Number: 5,080,506

[45] Date of Patent: Jan. 14, 1992

[54] OPTICAL FIBER TAP FOR MONITORING LASER INPUT POWER

[75] Inventors: Bruce D. Campbell, Portola Valley; Cathryn L. Ludtka-Peck, Mt. View; Robert J. Naidoff, Portola Valley; Theodore Calderone, Thousand Oaks, all of Calif.

[73] Assignee: Raynet Corp., Menlo Park, Calif.

[21] Appl. No.: 196,925

[22] Filed: May 20, 1988

[51] Int. Cl.⁵ .......................... G02B 6/26; G02B 6/42
[52] U.S. Cl. ................................................ 385/29
[58] Field of Search ............ 350/96.15, 96.29, 96.30

[56] References Cited

U.S. PATENT DOCUMENTS 4,410,235 10/1983 Klement et al. ............... 350/96.18
4,586,783 5/1986 Campbell et al. ............... 350/96.15

Primary Examiner—William L. Sikes
Assistant Examiner—Robert E. Wise
Attorney, Agent, or Firm—Dennis E. Kovach

[57] ABSTRACT

An output of a light source coupled to an optical fiber is controlled by an apparatus comprising a mode stripper for stripping a first part of the optical signal from the cladding of the optical fiber, means for bending the optical fiber and withdrawing a second part of the optical signal from a core of the fiber downstream from the stripper, means for detecting the second part of the optical signal, and feedback means for using the detected second signal part to control an output of the light source to better linearize an amount of power injected into the fiber.

15 Claims, 1 Drawing Sheet

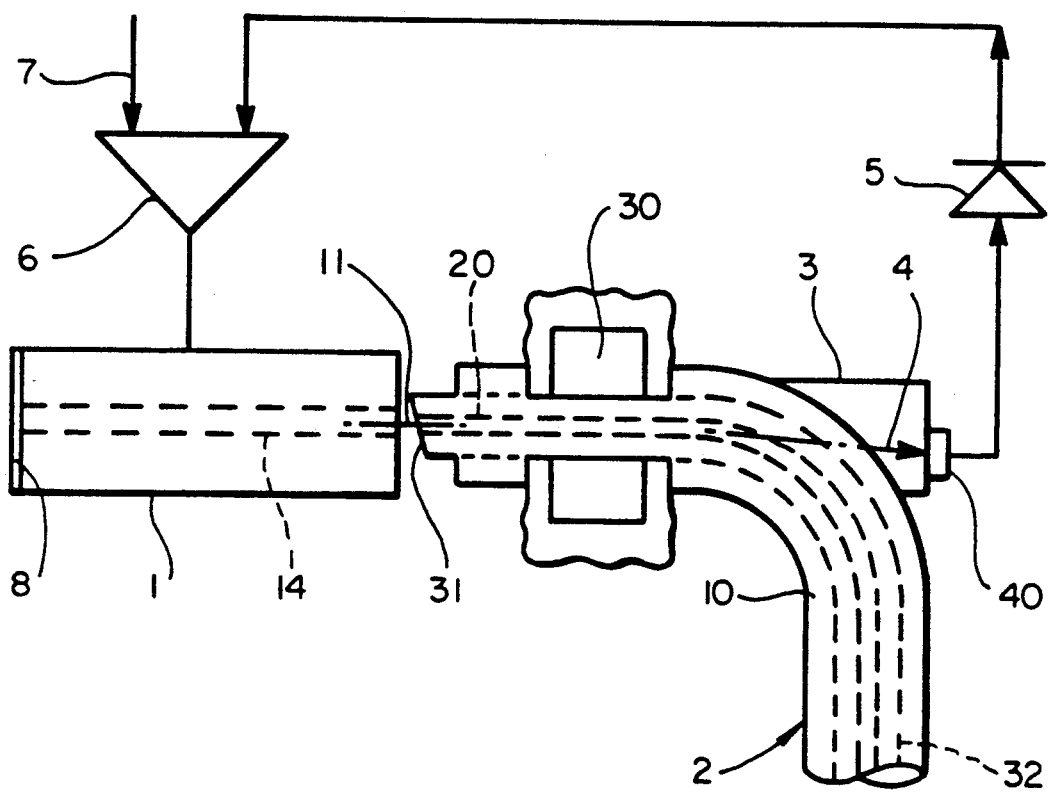
FIG_1

OPTICAL FIBER TAP FOR MONITORING LASER INPUT POWER

BACKGROUND OF THE INVENTION

The present invention relates to a tap for monitoring light within an optical fiber, the tap being particularly useful for controlling an amount of power injected into a single mode fiber from a semiconducting laser diode.

In an optical fiber communications system, it is oftentimes important to accurately control an amount of power injected into an optical fiber, especially if analog transmission is desired. When utilizing a laser in such a system, the output thereof varies over time due to environmental variations, such as temperature and humidity changes, and also due to aging of the laser. In addition, components used for packaging the laser and the optical fiber also tend to be somewhat unstable over time which results in an alignment of the optical fiber and the laser changing. Also since an emission angle of power from a laser changes with laser output power, a percentage thereof accepted by the fiber changes. These variables all affect an amount of power injected into the optical fiber from the laser, and such power variations are detrimental when analog modulation is to be used, especially amplitude modulation.

Numerous proposals have been made in the prior art for linearizing an output of the laser. Back facet monitors have been employed for monitoring an amount of light or optical power emitted from a back end of a laser, and this information is used to determine an amount of power emitted from a front end of the laser confronting the optical fiber. This method has the disadvantage that it is incapable of monitoring any power variations due to changes in fiber alignment over time, and also is incapable of monitoring power variations within a core of the optical fiber due to a change in an angular distribution of light emitted from the fiber which changes with laser output power.

U.S. Pat. Nos. 4,165,496 and 4,351,585 each disclose an optical fiber tap located on an optical fiber downstream from a laser, the tap withdrawing part of an optical signal within the fiber, this signal part being used for feedback control for controlling a power output of the laser. According to these references, the signal is tapped by terminating the fiber and creating a beveled end which is disposed in close proximity to a similarly shaped beveled end of a second optical fiber, the first beveled end causing a portion of the optical signal to be reflected off a face thereof and traversely out of the fiber for detection. A remainder of the signal propagates through the second optical fiber. The withdrawn signal part is then used for feed-back control of the laser output. These methods are disadvantageous since they create unacceptably high losses to the signal in the fiber, and they are relatively difficult to assemble and hence expensive to implement in view of the fact that precise beveled faces of fibers need to be formed and joined by a suitable nonindex matching medium. Finally, cladding modes are detected which introduce erroneous detected signal magnitudes, and hence acceptable feedback control at even low and modestly high speeds is quite difficult.

SUMMARY OF THE INVENTION

It is an object of the present invention to provide an improved tap for withdrawing part of an optical signal from an optical fiber.

It is a further object of the invention to provide an improved tap which is particularly useful in a feedback control loop for controlling and linearizing an output of a laser injected into a fiber, a preferred embodiment being for use with a single mode fiber.

It is a further object of the invention to provide an improved analog modulation network using such a tap.

These and other objects of the invention are achieved by connecting an end of an optical fiber to a laser, stripping cladding modes from the fiber downstream from the laser, and withdrawing and detecting part of an optical signal within a fiber core downstream from where the cladding modes are stripped at a fiber bend by passing the signal part through a cladding and buffer of the fiber and into an optical coupler whereat it is available for immediate detection or remote detection. Preferably, the optical signal part is withdrawn in close proximity to the laser to allow for relatively high analog signal modulation in a linear fashion. Since laser output is monitored along a section of the optical fiber, it is advantageous to metalize a back facet of the laser so as to increase an output thereof, or disposed some other kind of reflective coating thereon.

These and other objects of the invention will become more apparent by reference to the accompanying drawings and detailed description of the preferred embodiments.

BRIEF DESCRIPTION OF THE DRAWINGS

FIG. 1 illustrates a preferred embodiment of the invention.

DESCRIPTION OF THE PREFERRED EMBODIMENTS

The invention is most suitable for use with optical fibers including a core surrounded by a cladding, the core and cladding preferably being made of glass, the glass cladding having a coating therearound. The coating generally comprises a polymer and generally consists of a buffer and/or a buffer and one or more jacket layers. In general, it is most useful that the buffer have an index of refraction greater than the cladding so as to strip cladding modes from the cladding so as to maintain an acceptable bandwidth for the fiber. The invention is useable for both single mode and multimode fiber, and optimum results are achieveable with single mode fiber when laser feedback control is a desired aim.

FIG. 1 illustrates a first preferred embodiment of the invention. Referring to this figure, a semiconducting laser diode 1 includes a laser cavity 14 which generates optical signals which are injected into an optical fiber 2. The optical fiber 2 comprises a core 20 surrounded by a fiber cladding 32 surrounded by a fiber coating, e.g. buffer 10.

Conventionally, a signal 11 injected into such a fiber includes core modes, cladding modes, and buffer modes. The buffer modes are quickly attenuated due to a high attenuation of the buffer material, e.g. within several tens of meters, and the cladding modes are conventionally stripped from the cladding and into the buffer since it is generally provided with an index of refraction equal to or higher than that of the cladding. Accordingly, after relatively short distances, the fiber 2 includes only core modes. For the case of single mode fiber, part of the signal power of the core modes also propagates within the fiber cladding, as is well understood in the art.

According to the invention, part 4 of the signal 11 is withdrawn from the optical fiber 2 at a location in close proximity to the laser 1 by utilizing a passive tap which withdraws light from the fiber core 20 by passing the signal part 4 through the fiber cladding 32 and buffer 10 and into an optical coupler 3. The coupler 3 preferably has an index of refraction equal to or higher than the fiber cladding, most preferably equal or close to equal to that of the fiber buffer. A preferred bend radius for withdrawing the signal part 4 is between 2 mm and 15 mm, preferably between 3 mm and 6 mm, and a preferred sector angle about which the fiber is bent is less than 45°, preferably less than 30°, and also preferably more than 5°.

Examples of preferred passive tap constructions are described in U.S. Pat. Nos. 4,728,169; 4,586,783; 4,741 585; and in U.S. application Ser. No. 754,035, now U.S. Pat. No. 4,768,854, all the disclosures of which are incorporated herein by reference.

It is advantageous to place the tap for withdrawing the signal part 4 in close proximity to the laser 1 to allow from high laser modulation speeds, e.g. greater than 200 mHz, preferably greater than 500 mHz. A preferred distance between fiber end 31 and a location where the signal part 4 is withdrawn is less than 30 cm, preferably less than 10 cm, preferably less than 5 cm, more preferably less than 3 cm, most preferably less than 2 cm. Cladding and buffer modes injected into the fiber by the laser may not be sufficiently attenuated prior to withdrawing the signal part 4, and accordingly the invention further includes the use of a mode stripper 30 located between the front end 31 of the optical fiber and the location where the signal part is withdrawn.

According to one embodiment of the invention, the mode stripper is preferably disposed completely around an outer circumference of the fiber, the mode stripper comprising a material which has an index of refraction at least equal to or higher than that of the fiber cladding and which makes good optical contact with the outer surface of the fiber cladding. To achieve optimum results, preferably the mode stripper is disposed in direct contact with the fiber cladding as illustrated which requires that a short section of the fiber buffer be removed. Typically, removal of a short section of an optical fiber buffer is not difficult since the buffer comprises a polymer which is readily removable from the fiber cladding. A preferred material for the mode stripper is glass ($SiO_2$) since its index of refraction can easily be made to closely match that of the cladding which is commonly $SiO_2$. The fiber end is positioned and held in place to a substrate mounting means preferably by using solder or similar material, the material preferably being nontransparent.

Reference numeral 5 indicates the means for detecting the withdrawn signal part 4, e.g. a photo diode, and an output thereof is transmitted to feedback control circuitry 6 via electrical circuit 40 into which is also fed an analog signal 7 which is to be used by the laser 1 in generating its signal. Accordingly, it is evident that the feedback control circuitry can adjust its output in response to its input to insure that the withdrawn signal 4 is representative of the analog signal 7 to be generated by the laser 1, as desired.

The invention further includes an analog network which includes the laser and tap as described, preferably the laser generating AM modulated video signals.

According to a further feature of the invention, a front end 31 of the optical fiber 2 has a beveled end or conical end to prevent reflections therefrom from entering the laser cavity 14 and accordingly interfering with laser amplitude signal generation. Also, since the tap is used to linearize the laser power captured by the fiber as guided modes, efficiencies are improved by making a back facet of the laser reflective, e.g. by disposing a reflective coating 8 thereon.

Finally, when used as a tap for a multimode fiber, it is advantageous to dispose means for redistributing the core modes so as to reach equilibrium, one preferred method of accomplishing this being by disposing a mode disperser (not shown) upstream of the stripper 30.

Though the invention has been described by reference to certain preferred embodiments thereof, the invention is not to be limited thereby and only by the appended claims.

What is claimed is:

1. An apparatus for controlling an output of a light source transmitting an optical signal into a single mode optical fiber, comprising:
   means for stripping a first part of the optical signal from a cladding of the single mode optical fiber;
   means for bending the optical fiber downstream from the stripping means and withdrawing a second part of the optical signal from a core of the fiber downstream from the stripping means;
   means for detecting the second signal part;
   feedback means for using the detected second signal part to control an output of the light source to better linearize an amount of power injected into the fiber.

2. The apparatus of claim 1, the light source comprising a semiconducting laser.

3. The apparatus of claim 2, the stripping means comprising an optical coupler in contact with an entire outer circumferential surface of the fiber cladding at a straight section thereof.

4. The apparatus of claim 2, the second signal part being withdrawn from the optical fiber within 5 cm of an end of the fiber confronting the laser.

5. The apparatus of claim 2, the second signal part being withdrawn from the optical fiber within 3 cm of an end of the fiber confronting the laser.

6. The apparatus of claim 2, a back facet of the laser having a reflective coating thereon.

7. The apparatus of claim 6, an end of the fiber confronting a front facet of the laser being beveled an amount sufficient to prevent reflections from the front end from reentering a light generating cavity of the laser.

8. The apparatus of claim 1, the bending means withdrawing the second signal part through the fiber cladding and a coating of the fiber and into an optical coupler at the fiber bend.

9. The apparatus of claim 8, the optical coupler having an index of refraction greater than that of the fiber cladding.

10. An optical fiber analog modulation network, comprising:
   a single mode optical fiber;
   a laser confronting an end of the optical fiber for generating an optical signal and injecting the optical signal into the optical fiber;

means for stripping cladding and buffer modes from the optical fiber downstream from the fiber end;

means for bending and withdrawing a part of the optical signal from the fiber downstream from the stripping means;

means for detecting the optical signal part;

means for comparing a magnitude of the detected optical signal part to a magnitude of the generated optical signal and adjusting the generated optical signal magnitude in response thereto so as to linearize power input into the fiber.

11. The network of claim 10, the bending and withdrawing means being located within 5 cm of the fiber end.

12. The network of claim 10, a back facet of the laser having a reflective coating thereon, a front surface of the fiber end being beveled so as not to reflect a part of the optical signal back into a light generating cavity of the laser.

13. The network of claim 10, the optical signal being withdrawn through a fiber cladding and a fiber buffer at a fiber bend and into an optical coupler.

14. An apparatus for controlling an output of a light source transmitting an optical signal into an optical fiber, comprising:

an optical fiber having a core, a cladding, and a buffer, a section of the buffer being removed in a vicinity of a front end of the fiber;

an optical coupler disposed in contact with the cladding in the vicinity of the fiber front end for stripping cladding modes from the fiber;

means for withdrawing part of the optical signal from a core of the fiber downstream from the stripping means;

means for detecting the signal part;

feedback means for using the detected signal part to control an output of the light source to better linearize an amount of power injected into the fiber.

15. The apparatus of claim 14, the light source comprising a semiconductor laser.

* * * * *